(12) United States Patent
Choi et al.

(10) Patent No.: US 10,693,202 B2
(45) Date of Patent: Jun. 23, 2020

(54) BATTERY FOR VEHICLE AND METHOD FOR CONTROLLING THE SAME

(71) Applicants: Hyundai Motor Company, Seoul (KR); Kia Motors Corporation, Seoul (KR)

(72) Inventors: Yong Hwan Choi, Gyeonggi-do (KR); Hae Kyu Lim, Gyeonggi-do (KR); Gun Goo Lee, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 53 days.

(21) Appl. No.: 16/235,002

(22) Filed: Dec. 28, 2018

(65) Prior Publication Data
US 2019/0140330 A1    May 9, 2019

Related U.S. Application Data

(62) Division of application No. 15/249,707, filed on Aug. 29, 2016, now Pat. No. 10,205,205.

(30) Foreign Application Priority Data

Dec. 11, 2015  (KR) .................. 10-2015-0177356

(51) Int. Cl.
*H01M 10/6572* (2014.01)
*H01M 10/6563* (2014.01)
(Continued)

(52) U.S. Cl.
CPC ........ *H01M 10/6572* (2015.04); *H01L 35/32* (2013.01); *H01M 10/486* (2013.01);
(Continued)

(58) Field of Classification Search
CPC ........... H01M 10/6572; H01M 10/613; H01M 10/6563; H01M 10/486
See application file for complete search history.

(56) References Cited

U.S. PATENT DOCUMENTS

2007/0240751 A1   10/2007   Takahashi
2013/0220394 A1    8/2013   Higashida et al.
(Continued)

FOREIGN PATENT DOCUMENTS

KR   10-2004-0045937 A   6/2004
KR   10-2006-0027579 A   3/2006
(Continued)

*Primary Examiner* — Stewart A Fraser
(74) *Attorney, Agent, or Firm* — Mintz Levin Cohn Ferris Glovsky and Popeo, P.C.; Peter F. Corless

(57) ABSTRACT

A battery for a vehicle and a method for controlling the same are provided. The battery includes a housing in which a plurality of battery cells are disposed and a thermoelectric element that is disposed between the plurality of battery cells and provided with electrodes connected in a zigzag configuration. Since heat flows in a lengthwise direction of the battery cells, heat transfer efficiency with respect to the battery cells is significantly improved. By directly attaching the thermoelectric element to the battery cell, a gap between the battery cells is reduced, and a temperature of each battery cell is individually managed with ease.

3 Claims, 7 Drawing Sheets

(51) Int. Cl.
   *H01M 10/613*    (2014.01)
   *H01M 10/625*    (2014.01)
   *H01M 10/6551*   (2014.01)
   *H01L 35/32*     (2006.01)
   *H01M 10/48*     (2006.01)
   *H01M 10/42*     (2006.01)

(52) U.S. Cl.
   CPC ....... *H01M 10/613* (2015.04); *H01M 10/625* (2015.04); *H01M 10/6551* (2015.04); *H01M 10/6563* (2015.04); *H01M 2010/4271* (2013.01); *H01M 2220/20* (2013.01)

(56) References Cited

U.S. PATENT DOCUMENTS

| | | | |
|---|---|---|---|
| 2014/0030560 A1 | 1/2014 | Lev et al. | |
| 2014/0110097 A1* | 4/2014 | Kim | H01M 10/63 |
| | | | 165/287 |
| 2014/0318746 A1 | 10/2014 | Kwak et al. | |
| 2014/0371946 A1 | 12/2014 | Kwak et al. | |
| 2015/0380728 A1 | 12/2015 | Son et al. | |
| 2016/0372806 A1* | 12/2016 | Lee | H01M 10/617 |

FOREIGN PATENT DOCUMENTS

| | | |
|---|---|---|
| KR | 10-0842152 | 6/2008 |
| KR | 10-2011-0073166 A | 6/2011 |
| KR | 10-2012-0013479 A | 2/2012 |
| KR | 10-2012-0029837 A | 3/2012 |
| KR | 10-2012-0056597 | 6/2012 |
| KR | 10-1428383 | 8/2014 |

\* cited by examiner

BATTERY FOR VEHICLE AND METHOD FOR CONTROLLING THE SAME

CROSS-REFERENCE TO RELATED APPLICATION

This application is a divisional of U.S. patent application Ser. No. 15/249,707, filed Aug. 29, 2016, which is based on and claims the benefit of priority to Korean Patent Application No. 10-2015-0177356, filed Dec. 11, 2015, in the Korean Intellectual Property Office, the disclosure of which is incorporated herein in its entirety by reference.

TECHNICAL FIELD

The present disclosure relates to a battery for a vehicle and a method for controlling the same and, more particularly, to a battery for a vehicle and a method for controlling the same for maintaining an optimum temperature for a high voltage battery system.

BACKGROUND

In general, electric vehicles (EVs) are continuously being developed as part of efforts to ease environmental problems and develop alternative energy sources. An EV is a vehicle that can be powered by driving an alternating current (AC) or direct current (DC) motor using power of a battery. EVs are classified into battery electric vehicles (BEVs) and hybrid electric vehicles (HEVs). A BEV uses power of a battery to drive a motor, and recharges the battery when the power is consumed. Meanwhile, an HEV generates electricity by the running of an engine to charge a battery, and the generated electricity drives an electric motor, thereby making the vehicle move.

In addition, HEVs are classified into two basic types: series and parallel. In series-type HEVs, mechanical energy output from an engine is converted into electric energy through an electrical generator and the electrical energy is supplied to a battery or a motor. The motor drives the drivetrain, and the engine and the generator are added for increasing mileage compared to that of a conventional EV. Meanwhile, parallel-type HEVs run on the power of battery and/or the engine (gasoline or diesel). The parallel-type HEVs use two power sources and can be driven simultaneously by the engine and the motor according to driving conditions.

Further, an EV is mounted with an electric motor (driving motor) for driving a vehicle and a high voltage battery for supplying power to the electric motor. The battery is a source of energy for driving the electric motor and is capable of supplying power to the electric motor using an inverter. The battery is a secondary battery that can be charged and discharged. The battery may be mounted in the form of a battery pack in an EV, and battery modules including a plurality of cells may be connected in series to obtain necessary power.

The battery mounted in the EV inevitably generates heat during the operations thereof, and thus, a technique for controlling the heat generate may also be required. For example, the battery affected by the generated heat may be cooled using air cooling or water cooling. Water cooling is advantageous in excellent cooling performance, but is disadvantageous in relatively complex configuration, cost, marketability, and the like, and thus, air cooling is more often being utilized instead of water cooling.

SUMMARY

An aspect of the present disclosure provides a battery module and a control method thereof for solving the issue with regard to heat dissipation and heat absorption by inserting a thermoelectric element between adjacent battery cells and for improving temperature increase and cooling performance by managing a temperature of the battery module. An aspect of the present disclosure may also provide a battery module for a vehicle and a control method thereof in which a thermoelectric element utilizes heat dissipation and heat absorption occurring in a vertical direction, to thus eliminate a heat pipe connecting the thermoelectric element to battery cells and a heat sink for cooling the thermoelectric element. Technical subjects are not limited to the foregoing subjects and any other technical subjects not mentioned will be clearly understood by a person skilled in the art from the following description.

According to an exemplary embodiment of the present disclosure, a battery for a vehicle may include: a housing in which a plurality of battery cells are arranged; and a thermoelectric element disposed between the plurality of battery cells and having electrodes connected in a zigzag configuration. The thermoelectric element may include a film substrate on which the electrodes are disposed, and may include a heat absorption part disposed on a first side thereof and configured to absorb the heat of the battery cells, and a heat dissipation part disposed on a second side thereof and configured to dissipate the heat absorbed by the heat absorption part externally of the battery cells. The heat dissipation part may protrude externally from the battery cells to cool the heat dissipation part using cooling air passing in a lengthwise direction of the battery cells The battery may further include a battery management system configured to adjust changes in directions of the heat absorption part and the heat dissipation part. The battery management system may further be configured to adjust the cooling air based on a measured temperature of the thermoelectric element and cool the thermoelectric element using air cooling or Peltier cooling. The thermoelectric element may have the heat absorption part attached thereto to absorb the heat generated by the battery cells, and the heat may be transferred from the heat absorption part to the heat dissipation part.

The battery may further include a temperature sensor configured to measure a temperature of the battery cell, and the temperature sensor may be configured to measure a temperature of the thermoelectric element when a measured temperature of the battery cell is greater than a predetermined first temperature value. The battery management system may be configured to change a direction of current to cool the thermoelectric element when a temperature of the thermoelectric element is greater than a predetermined value. The battery may further include a temperature sensor configured to measure a temperature of the battery cell, and the battery management system may be configured to change a direction of current to increase a temperature of the thermoelectric element when a measured temperature of the battery cell is less than a predetermined value.

The electrodes may include a P-type thermopile and an N-type thermopile, and a first end and a second end of the P-type thermopile and a first end and a second end of the N-type thermopile may be connected in a zigzag configuration. The thermoelectric element may be provided as a planar or film type thermoelectric element to be attached to the battery cell. The battery may further include a temperature sensor configured to measure a temperature of the battery cell, and the temperature sensor may be configured to measure the temperature of the battery cell from the heat absorption part attached to the battery cell.

According to another exemplary embodiment of the present disclosure, a battery for a vehicle may include: a plurality of battery cells; and a thermoelectric element disposed between the plurality of battery cells. The thermoelectric element may include a heat absorption part disposed on a first side thereof and attached to the plurality of battery cells to absorb heat of the plurality of battery cells, and a heat dissipation part disposed on a second side thereof and protruding externally from the plurality of battery cells to dissipate the heat absorbed by the heat absorption part. Cooling air may pass to the heat dissipation part protruding externally from the plurality of battery cells. Details of other exemplary embodiments are included in the detailed description and drawings.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
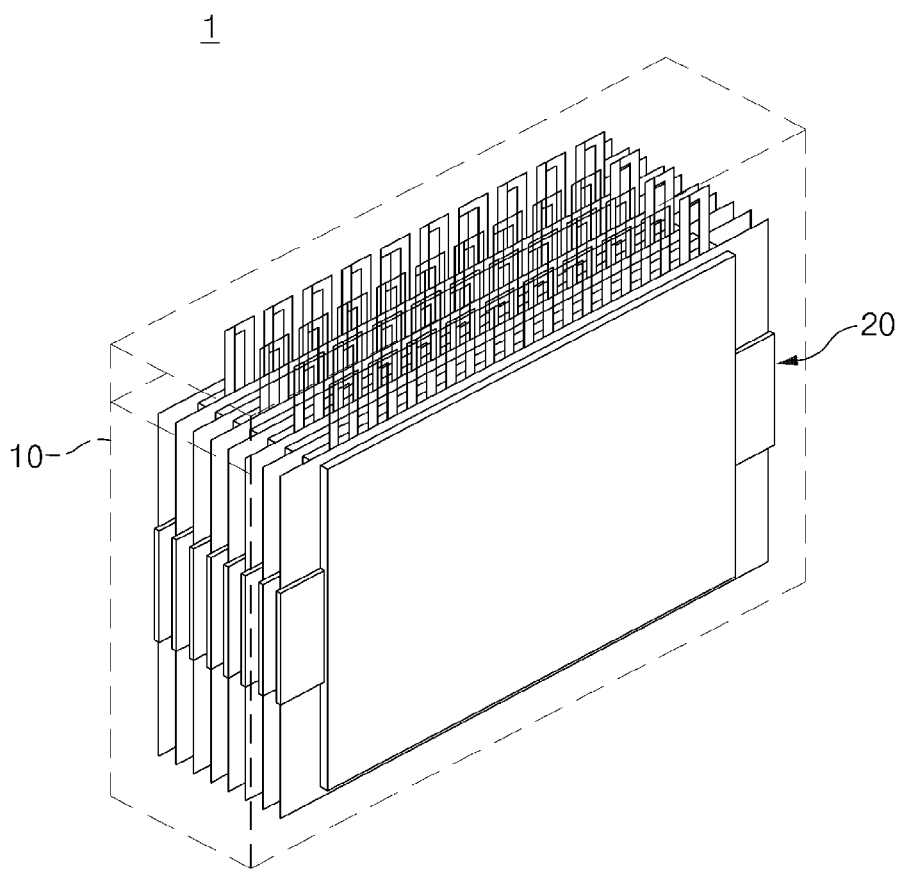
FIG. 1 is a perspective view illustrating a battery for a vehicle according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referral to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Exemplary embodiments of the present disclosure will be described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Hereinafter, a battery module according to exemplary embodiments of the present disclosure will be described with reference to the accompanying drawings.

Figure 2:
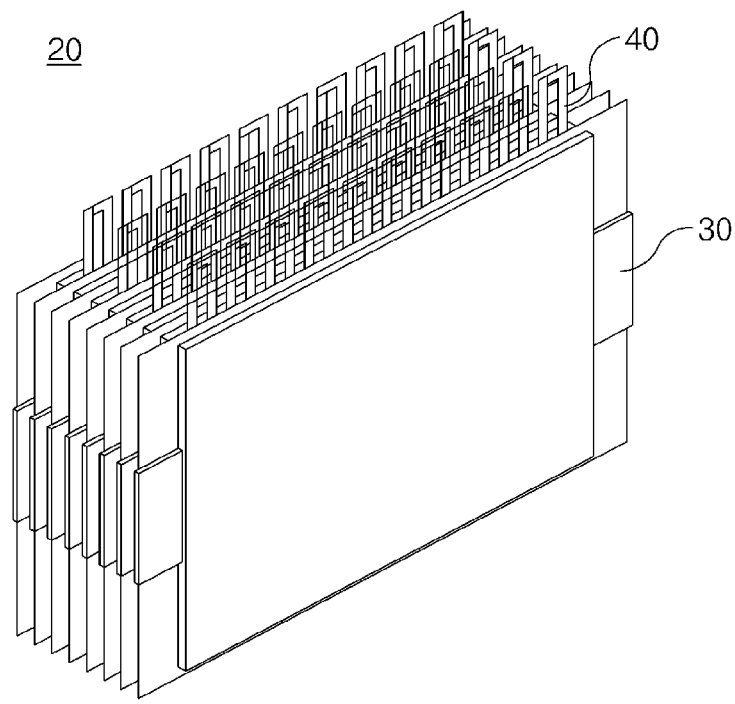
FIG. 2 is a perspective view illustrating a battery module according to an exemplary embodiment of the present disclosure.
Figure 3:
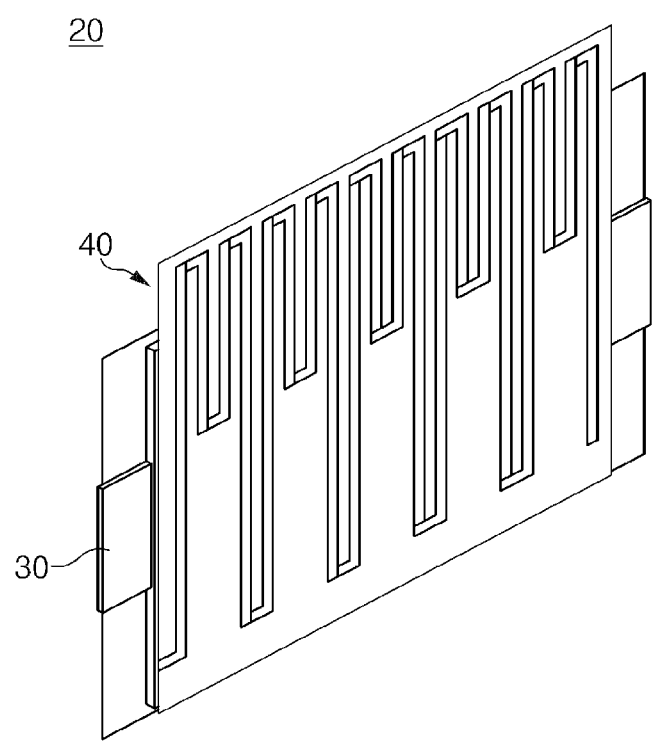
FIG. 3 is a perspective view illustrating a battery cell according to an exemplary embodiment of the present disclosure.
Figure 4:
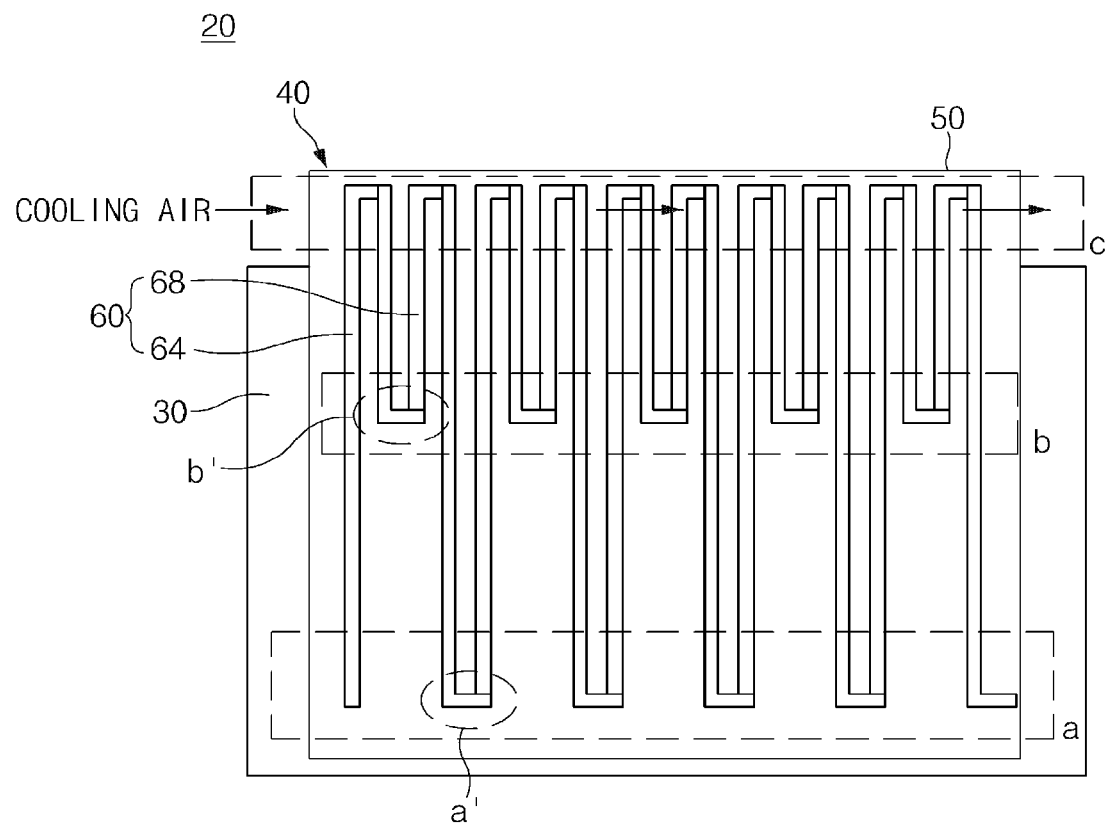
FIG. 4 is a front view of FIG. 3 according to an exemplary embodiment of the present disclosure.
Figure 5:
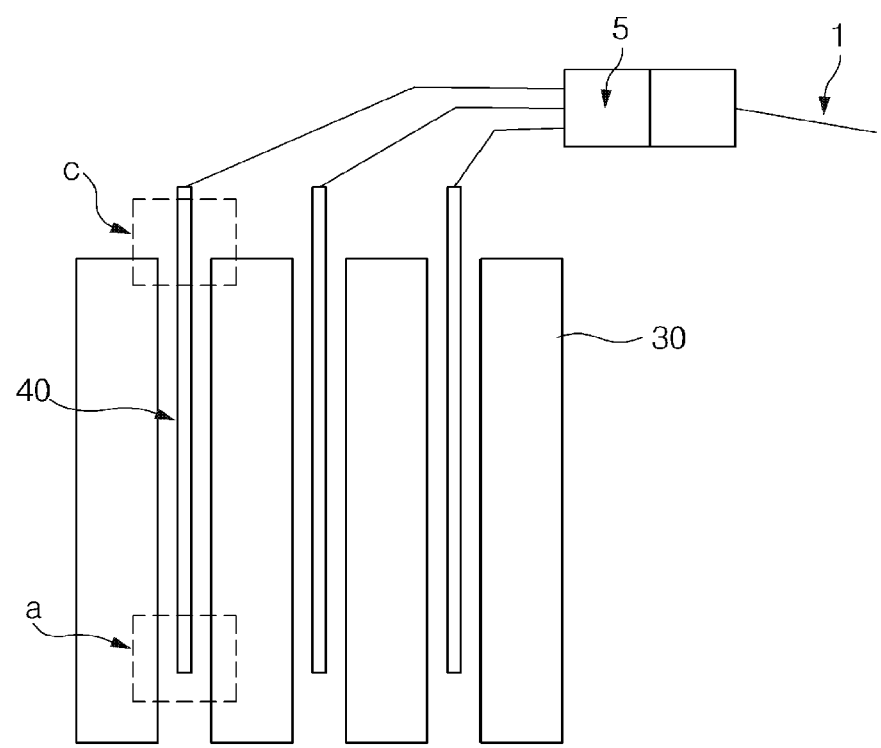
FIG. 5 is a side view of FIG. 2 according to an exemplary embodiment of the present disclosure.
Figure 6:
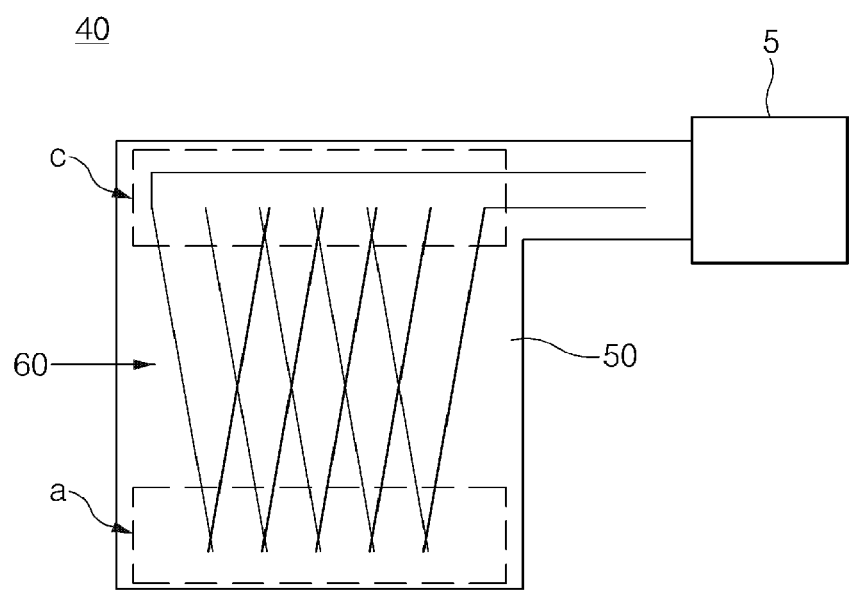
FIG. 6 is a front view illustrating a battery cell according to another exemplary embodiment of the present disclosure.

FIG. 1 is a perspective view illustrating a battery for a vehicle according to an exemplary embodiment of the present disclosure; FIG. 2 is a perspective view illustrating a battery module according to an exemplary embodiment of the present disclosure; FIG. 3 is a perspective view illustrating a battery cell according to an exemplary embodiment of the present disclosure; FIG. 4 is a front view of FIG. 3; FIG. 5 is a side view of FIG. 2; and FIG. 6 is a front view illustrating a battery cell according to another exemplary embodiment of the present disclosure. Exemplary embodiments related to a battery for a vehicle and a method for controlling the same may be modified by a person skilled in the art, and the present exemplary embodiment provides a battery for a vehicle and a method for controlling the same.

A battery module according to an exemplary embodiment of the present disclosure will be described with reference to FIGS. 1 to 3. A battery pack 1 may be charged with electric energy to drive an electric motor and an electric vehicle may run on the power of the electric motor. The battery pack 1 is a secondary battery that may be charged and discharged, and may be mounted in the form of a pack in an electric vehicle.

The battery pack 1 may include a battery module 20 having a plurality of battery cells 30 electrically connected to each other, a housing 10 having the battery module 20 disposed in the interior thereof, and a thermoelectric element 40 disposed between the plurality of battery cells 30 and provided with electrodes 60 connected in a zigzag configuration. The housing 10 may accommodate the plurality of battery cells 30 therein. The battery module 20 may be formed of the plurality of battery cells 30 arranged in one direction. The plurality of battery cells 30 may be electrically connected to each other and may include the thermoelectric element 40.

FIG. 4 is a front view of FIG. 3, and FIG. 5 is a side view of FIG. 2. The thermoelectric element 40 may include heat absorption parts a and b for absorbing heat of the battery cell 30 on a first side thereof, and a heat dissipation part c for dissipating the heat absorbed by the heat absorption parts a and b externally of the battery cell 30 on a second side thereof. The thermoelectric element 40 may be provided in the form of a planar type or film type element to be attached to the battery cell 30. The thermoelectric element 40 may be a thermoelectric element using the Peltier effect, and heating and cooling may occur through changes in current direction.

In particular, the thermoelectric element 40 may include a film substrate 50. The electrodes 60 may be attached to the film substrate 50, and the film substrate 50 may be attached to the battery cell 30. Accordingly, heat generated by the battery cell 30 may be absorbed by the electrodes 60 through the film substrate 50. The thermoelectric element 40 may include the plurality of electrodes 60 connected to each other in a zigzag configuration and attached to the film substrate 50. The thermoelectric element 40 may be configured to adjust a temperature of the battery cell 30 by changing the amounts and directions of current based on the temperature of the battery cell 30.

Meanwhile, the thermoelectric element 40 may include the heat absorption parts a and b for absorbing heat generated by the battery cell 30, and may be configured to transfer the heat absorbed by the heat absorption parts a and b to the heat dissipation part c to dissipate the heat of the battery module 20. The thermoelectric element 40 may be configured to absorb heat by the heat absorption parts a and b and dissipate the heat externally of the battery module 20, or may be configured to absorb heat from the outside of the battery module 20 and transfer the heat to the heat absorption parts a and b. Particularly, the heat dissipation part c may protrude externally from the battery cell 30 to dissipate heat externally of the battery module 20. The heat dissipation part c may protrude externally from the battery cell 30 to be cooled by cooling air passing in a lengthwise direction of the battery cell 30. Additionally, a battery management system 5 may be included to adjust changes in the directions of the heat absorption parts a and b and the heat dissipation part c. The battery management system 5 may be configured to manage the switchover between at least one of the heat absorption parts a and b and the heat dissipation part c. The battery management system 5 may be operated by a controller.

In particular, the battery management system 5 may be provided for adjusting the temperature of the battery pack 1, and may be configured to maintain the battery pack 1 at a substantially constant temperature by heating, maintaining a substantially constant temperature, and cooling with respect to the battery pack 1, to improve the energy efficiency and lifespan of the battery pack 1. The battery management system 5 may be configured to adjust cooling air (e.g., the amount of cooling air) based on a measured temperature of the thermoelectric element 40. Additionally, the battery management system 5 may be configured to cool the thermoelectric element 40 in an air-cooling or Peltier cooling method.

The thermoelectric element 40 may include a temperature sensor (not shown) disposed between the battery cells 30 to measure the temperatures of the battery cells 30. A plurality of temperature sensors may be disposed between the battery cells 30 to measure the temperatures of the battery cells 30 and the temperatures of the heat absorption parts a and b. The temperature sensor may be configured to measure the temperature of the battery cell 30 from the heat absorption parts a and b attached to the battery cell 30. When the measured temperature of the battery cell 30 is greater than a predetermined first temperature value, the temperature sensor may be configured to measure the temperature of the thermoelectric element 40. When the temperature of the thermoelectric element 40 is greater than a predetermined value, the battery management system 5 may be configured to change a direction of current to cool the thermoelectric element 40. When the measured temperature of the battery cell 30 is less than a predetermined value, the battery management system 5 may be configured to change a direction of current to increase the temperature of the thermoelectric element 40.

The electrode 60 may include a P-type thermopile 64 and an N-type thermopile 68, wherein a first end and a second end of the P-type thermopile 64 and a first end and a second end of the N-type thermopile 68 may be connected in a zigzag configuration. In particular, the first end of the P-type thermopile 64 and the first end of the N-type thermopile 68 may be connected to each other and attached to portions of the film substrate 50 to form the heat absorption parts a and b, and the second end of the P-type thermopile 64 and the second end of the N-type thermopile 68 may be connected to each other and attached to a portion of the film substrate 50 to form the heat dissipation part c. The heat dissipation part c may be disposed on the portion of the film substrate 50 outside of the battery cell 30. Accordingly, heat may be absorbed from the heat absorption parts a and b attached to the film substrate 50 and be transferred to the heat dissipation part c.

Figure 7:
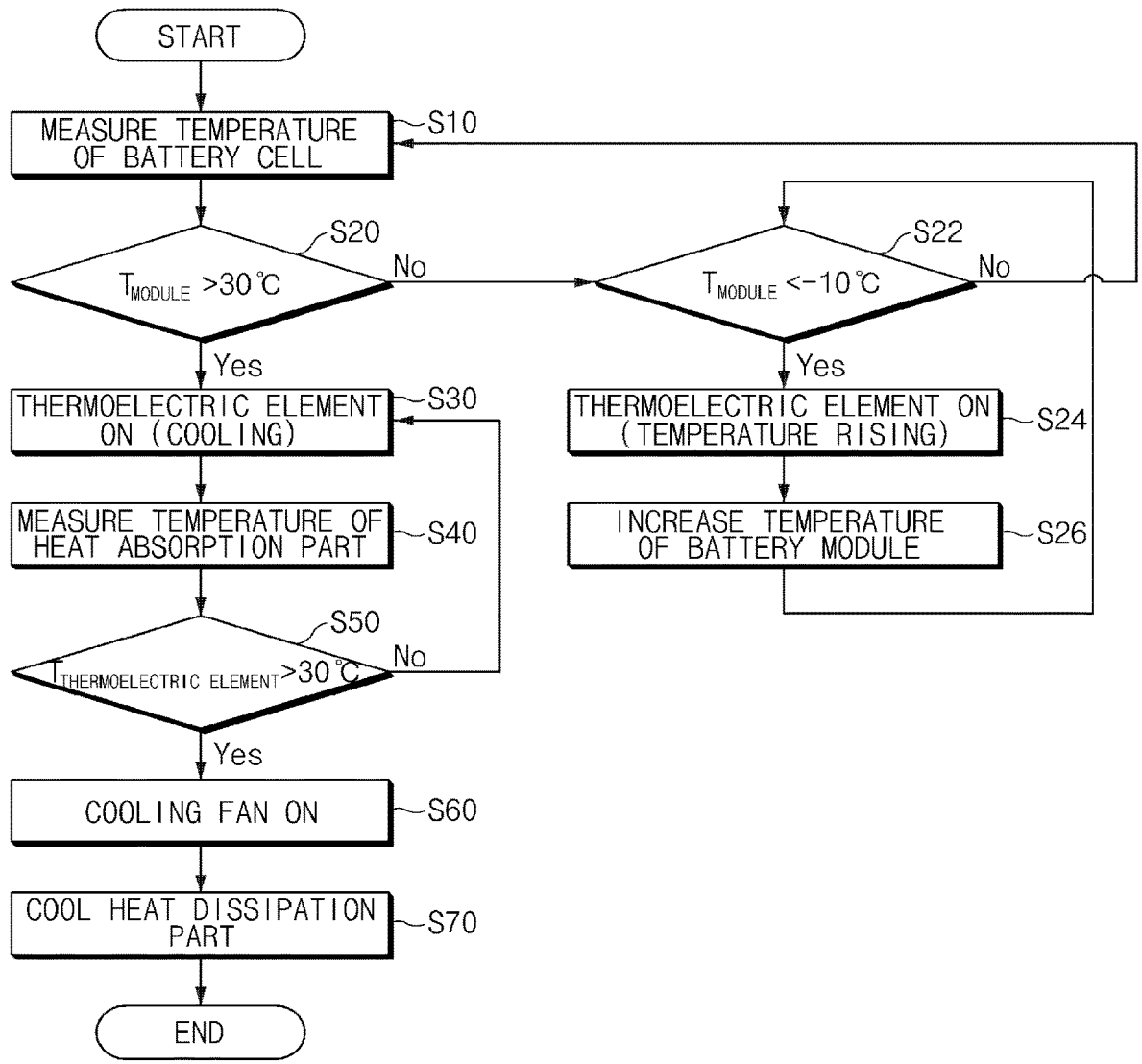
FIG. 7 is a flowchart illustrating a method for controlling a battery for a vehicle according to an exemplary embodiment of the present disclosure.

Meanwhile, as stated above, when the temperature of the thermoelectric element 40 is low (e.g., less than a predetermined temperature), the battery management system 5 may be configured to change the direction of current to cause the switchover in which the heat dissipation part c may be switched to a heat absorption part c' and the heat absorption parts a and b may be switched to heat dissipation parts a' and b'. For example, the switched heat absorption part c' may be configured to absorb heat and transfer the absorbed heat to the switched heat dissipation part b' to increase the temperature of the thermoelectric element 40, whereby the temperature of the thermoelectric element 40 may be maintained substantially constant Operations of a battery for a vehicle configured as described above and a control method thereof, according to exemplary embodiments of the present disclosure, will be described hereinafter. FIG. 1 is a perspective view illustrating a battery for a vehicle according to an exemplary embodiment of the present disclosure, and FIG. 3 is a perspective view illustrating a battery cell according to an exemplary embodiment of the present disclosure. FIG. 7 is a flowchart illustrating a method for controlling a battery for a vehicle according to an exemplary embodiment of the present disclosure.

With reference to FIGS. 1, 3, and 7, a battery for a vehicle according to an exemplary embodiment of the present disclosure will be described. A temperature of the battery cell 30 may be measured by a temperature sensor disposed in the battery cell 30 (S10). A first temperature value ($T_{module}$) of the battery cell 30 may be compared with a predetermined value which has been predetermined by the battery management system 5 (S20).

Particularly, when the first temperature value ($T_{module}$) is greater than the predetermined value which has been predetermined by the battery management system 5, a temperature of the thermoelectric element 40 may be measured to cool the battery cell 30 (S30). When the first temperature value ($T_{module}$) is greater than the predetermined value, temperatures of the heat absorption parts may be measured (S40). Then, a second temperature value ($T_{thermoelectric\ element}$), which has been obtained by measuring the temperature of the thermoelectric element 40, may be compared with the predetermined value (S50). When the second temperature value ($T_{thermoelectric\ element}$) is greater than the predetermined value, the battery management system 5 may be configured to activate a cooling fan (S60). The heat dissipation part c may be cooled by the cooling fan (S70).

Meanwhile, in operation (S20) of comparing the first temperature value and the predetermined value, the predetermined value may include a second predetermined value less than a first predetermined value which has been predetermined for comparison with the first temperature value. The second predetermined value may be compared with the first temperature value (S22). When the first temperature value is less than the second predetermined value, the temperature of the thermoelectric element 40 may be increased (S24). For example, when the temperature of the module exceeds about 30° C., the thermoelectric element 40 may be cooled. When the temperature of the module is less than about −10° C., the temperature of the thermoelectric element 40 may be increased (S26).

In addition, in the measuring of the temperature of the thermoelectric element 40, the temperatures of the heat absorption parts b' and c' attached to the battery cell 30 and absorbing heat of the battery cell 30 may be measured to measure the heat of the battery cell 30. Thus, the heat flows in a lengthwise direction of the battery cell, whereby heat transfer efficiency with respect to the battery cells may be significantly improved. By directly attaching the thermoelectric element to the battery cell, a gap between the battery cells may be reduced, and a temperature of each battery cell may be individually managed with ease.

While a battery for a vehicle and a method for controlling the same according to exemplary embodiments have been shown and described above, they are not limited thereto, but may be variously modified and altered by selectively combining all or part of individual exemplary embodiments. As set forth above, a battery for a vehicle and a method for controlling the same according to exemplary embodiments of the present disclosure may have one or more advantages, as follows: First, since heat flows in a lengthwise direction of the battery cells, heat transfer efficiency with respect to the battery cells may be significantly improved. Second, by directly attaching the thermoelectric element to the battery cell, a gap between the battery cells may be reduced, and a temperature of each battery cell may be individually managed with ease. Advantages and effects are not limited to the foregoing contents and any other technical effects not mentioned herein may be clearly understood by a person skilled in the art from the description of claims.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A method for controlling a battery for a vehicle, comprising:
    measuring, by a temperature sensor disposed in a battery cell, a temperature of the battery cell;
    comparing, by a controller, a first temperature value of the battery cell with a predetermined value which has been predetermined;
    measuring, by the temperature sensor, a temperature of a thermoelectric element when the predetermined value is less than the first temperature value; and
    activating, by the controller, a cooling fan to cool the thermoelectric element when a second temperature value, which has been obtained by measuring the temperature of the thermoelectric element, is greater than the predetermined value.

2. The method according to claim 1, wherein, in the comparing of the first temperature value with the predetermined value, the predetermined value includes a second predetermined value less than a first predetermined value which has been predetermined for comparison with the first temperature value, and when the first temperature value is less than the second predetermined value, the temperature of the thermoelectric element is increased.

3. The method according to claim 1, wherein, in the measuring of the temperature of the thermoelectric element, a temperature of a heat absorption part of the thermoelectric element attached to the battery cell and absorbing heat of the battery cell is measured to measure the heat of the battery cell.

\* \* \* \* \*